United States Patent [19]

Paur

[11] Patent Number: 4,894,606

[45] Date of Patent: Jan. 16, 1990

[54] SYSTEM FOR MEASURING MISREGISTRATION OF PRINTED CIRCUIT BOARD LAYERS

[76] Inventor: Tom R. Paur, 400 East Lake Samm Road S.E., Redmond, Wash. 98053

[21] Appl. No.: 216,080

[22] Filed: Jul. 7, 1988

[51] Int. Cl.$^4$ ............................................. G01R 31/02
[52] U.S. Cl. .................................... 324/65 R; 174/266
[58] Field of Search ................... 324/73 PC, 537, 538, 324/158 R; 174/68.5; 361/403, 414

[56] References Cited

U.S. PATENT DOCUMENTS

| | | | |
|---|---|---|---|
| 3,243,498 | 3/1966 | Allen et al. | 174/68.5 |
| 3,859,711 | 1/1975 | McKiddy | 324/73 PC |
| 4,432,037 | 2/1984 | Brabetz | 174/68.5 |
| 4,510,446 | 4/1985 | Braun et al. | 324/73 PC |

Primary Examiner—Ernest F. Karlsen
Attorney, Agent, or Firm—Seed and Berry

[57] ABSTRACT

A system for measuring the amount of misregistration of layers of multilayer printed circuit boards. The system utilizes a conductive plane having a fixed pattern of apertures and a common contact portion. One plane is attached to each inward layer of the board at the same location for each layer. The aperatures have a predetermined and progressively increasing diameter. Uniform diameter through-hole conductors are formed in the layers after assembled, with one conductor extending through each of the apertures. For a board with all inward layers in perfect registration with the outward layer, incrementally increasing clearances exist between the conductors and the edges of the corresponding apertures. One or more of the conductors is in electrical contact with a plane if the inward layer to which attached is out of registration by an amount at least as great as the corresponding conductor clearance. A tester is used to determine if conductive paths exist between the conductors and the planes and for indicating the conductors for which a conductive path is determined to exist, thus quantitatively indicating the amount of layer misregistration.

4 Claims, 4 Drawing Sheets

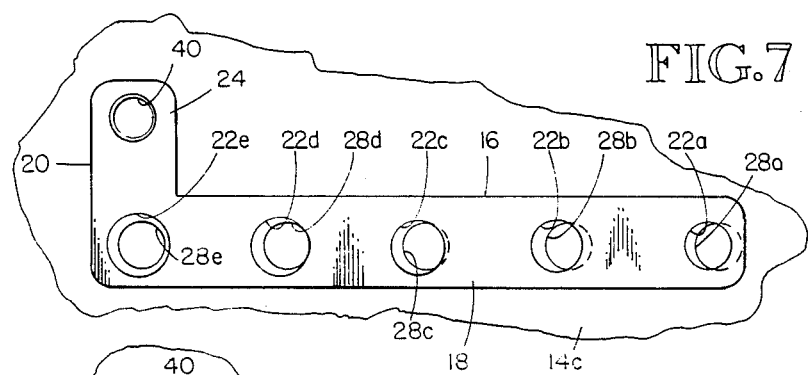
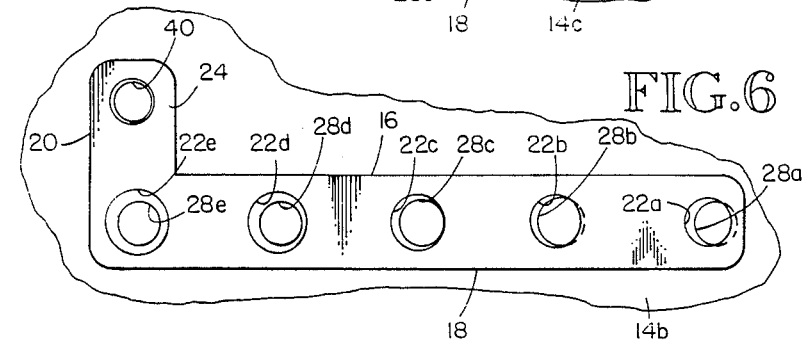
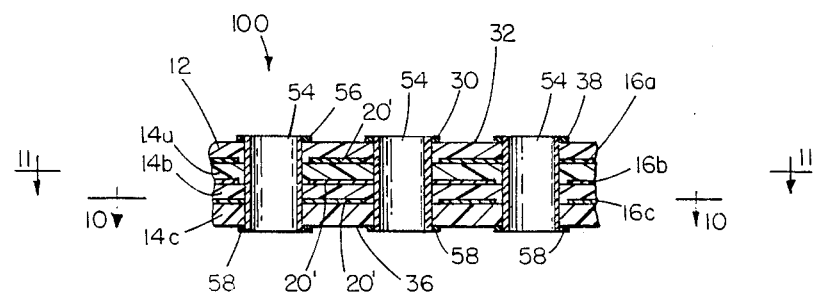

SYSTEM FOR MEASURING MISREGISTRATION OF PRINTED CIRCUIT BOARD LAYERS

DESCRIPTION

1. Technical Field

The present invention relates generally to printed circuit boards, and more particularly, to a system for measuring the amount of misregistration of printed circuit board layers.

2. Background Art

In the fabrication of printed circuit boards using multiple layers, each of the layer is fabricated in face-to-face juxtaposition and has electrically conductive traces thereon which require interconnection between the layers. Such interconnection is usually accomplished by a drilled and then metallic-plated through-hole which extends through the layers and is located to cause the plated through-hole to contact the particular traces or pads thereof on one or more of the layers and create an electrically conductive path between the desired traces on different layers. For such a fabrication technique to be effective, it is very important that each of the inner layers of the printed circuit board be in precise registration or alignment with an exterior layer of the printed circuit board so that the relative positions of the traces on different layers are predictable and the through-holes, which are formed after assembly of the layers, will make contact with the desired traces and only those traces. If an inner layer is out of registration with the exterior layer or with any of the other interior layers by too large of an amount, the through-hole will not contact the desired trace or contact an undesired trace, and a defective board will result.

As with most fabrication processes, perfect registration of inner layers with the exterior layer is not possible, and the size and placement of the traces must be designed to take into account the fact that some misregistration is inevitable. The larger the amount of misalignment anticipated, the larger the spaces between traces must be to ensure that the through-hole will contact only the desired traces. This reduces packaging densities on the printed circuit boards and hence increases the cost of the printed circuit boards required for a particular circuit.

In the past, after the printed circuit board was fabricated, it was possible to determine whether or not the layer-to-layer registration was correct or incorrect by simply determining whether or not the through-holes made electrical contact with all of the proper traces and no others. Usually, a particular through-hole was checked to make sure it was in contact with a particular trace, and if it was not, the board failed. On the other hand, if all of the through-holes, or however many that were checked, contacted all of the desired traces, the board passed. Rather than checking all through-holes, a sampling was often made. At other times, a test set of traces and through-holes (called a "test coupon") was created for the purpose of testing registration. In all situations, the test simply produced a "pass" or "no pass" result, without any quantification of the amount of layer misregistration involved.

Of course, the inner layers of the fabricated printed circuit board cannot be viewed to visually determine the amount of misregistration, at least not without destroying the board by cutting it apart. Thus, if a particular board passed the test, there was no guarantee that the board would not later fail due to thermal changes or mechanical flexing which might be sufficient to cause a through-hole to lose electrical contact with a desired trace or make electrical contact with an undesired trace. In other words, one could never be sure that a board which passed the registration test did not have marginally adequate layer-to-layer registration and would not later fail during use. As a result, larger-than-necessary allowances in size and position of traces and spaces therebetween were made to lessen the likelihood that a board that passed a registration test would subsequently fail during use because the layer-to-layer registration was barely within tolerance.

The packing densities of printed circuit boards have increased dramatically, with more and smaller components requiring increased number of interconnecting traces. This requires that the traces be reduced in size and the space between the traces be reduced accordingly. To assure accuracy in fabrication, the photo tooling, image transfer, etching, drilling, lamination and other processes involved in the fabrication of printed circuit boards must be controlled within even tighter tolerance limits. As the board manufacturers approach the inherent accuracy limitations on these processes, it becomes critical to quantitatively measure the amount of misregistration between layers rather than simply conducting a pass/no-pass registration test. While such knowledge is helpful, not knowing the amount by which the layers are out of registration, it is impossible to determine whether through-holes are making adequate electrical contact with traces or whether minimum electrical clearances are being maintained between through-holes and traces on the hidden inner layers of the printed circuit board.

It will therefore be appreciated that there has a been a significant need for a system for measuring the amount of misregistration of printed circuit board layers in quantitative terms. The system should allow the measurements to be conductive quickly, economically, and precisely. Such a system would avoid the current industry practice of overcompensating at the design phase to minimize the impact of inner layer misregistration which prevents the fabrication of printed circuit boards with greater densities. By overcompensating at the design phase, printed circuit boards many times have significant unused (i.e., wasted) space on the inner layers, which often leads to the need for additional layers. This adds significantly to the cost, while decreasing reliability. Also, the uncertainty over the actual minimum clearances that exist on the inner layers, with the likelihood that at least some of the printed circuit boards that have passed the test may fail later when in use as a result of thermal changes or mechanical flexing of the board, affects the reliability of printed circuit boards. In-service failures of boards occur more frequently than desired.

With the present invention, use of greater packaging density is practical since the manufacturer has a means of determining if the amount of misregistration is within permissible limits. This allows the designer to reduce the overall board size or to decrease the number of layers used. Furthermore, improved in-service reliability is achieved since printed circuit boards with marginally acceptable clearances can be identified and rejected before components are installed and the board put into use. The present invention fulfills these needs, and further provides other related advantages.

DISCLOSURE OF THE INVENTION

The present invention resides in a system for measuring the amount of misregistration of printed circuit board layers. The system includes a printed circuit board having a plurality of circuit board layers fabricated in face-to-face juxtaposition. Each of the layers has electrically conductive traces which require interconnection between the layers. The layers include an exterior layer and at least one inner layer. The layers are positioned in registration with each other within a predetermined maximum tolerance range.

An electrically conductive plane having a plurality of apertures therethrough and a common contact position is attached to each of the inner layers prior to the assembly of the layers together to fabricate the printed circuit board. The apertures and common contact portion for the plane have a predetermined placement pattern on the plane. When the board consists of a plurality of inner layers, each of the inner layers has at least one such plane and the plane is attached to the inner layer at a substantially identical location and orientation on the inner layer as the others of the planes are attached to the others of the planes inner layers. As a result, the aperture of each of the planes is in general alignment with correspondingly positioned apertures of the others of the planes, subject to deviation from perfect alignment as a result of the inner layers' being positioned out of registration with the exterior layer as a result of the fabrication process.

The board further includes a plurality of electrically conductive conductors formed in the layers after fabricated. The conductors are located relative to the exterior layer to position each of the conductors to extend through the layers and within the correspondingly positioned apertures of the planes attached to the inner layers. Each of the conductors and the corrrespondingly positioned apertures through which extending have relative sizes to produce a clearance between each conductor and aperture if the inner layer is in perfect registration with the exterior layer. The clearances for the conductors are of a predetermined and incrementally increasing size. the conductors may be plated through-holes.

The conductors are positioned out of electrical contact with all of the planes if each of the inner layers is in perfect registration with the exterior layers. One or more of the conductors will be in electrical contact with at least one of the planes if the inner layer to which attached is out of registration with the exterior layer by an amount at least as great the corresponding conductor clearance. The incrementally increasing clearances for the conductors in electrical contact with the planes give a means to indicate the amount of misregistration of at least one of the inner layers with the exterior layer.

An electrically conductive, common through-conductor is formed in the layers and is located relative to the exterior layer to position the common conductor to extend through the layers and each of the common contact portions of the planes and make electrical contact therewith. The common conductor may be a plated through-hole. When any one of the inner layers is out of registration with the exterior layer by a sufficiently large amount, one or more electrically conductive paths are established between the conductors, the plane of the inner layer out of registration and the common conductor. The greater any one of the inner layers is out of registration with the exterior layer, the more of the conductors with the corresponding progressively increasing clearances are in electrical contact with the plane of the inner layer which is out of registration. The particular ones of the conductors in electrical contact with the plane indicate the amount of misregistration of the inner layer.

In a preferred embodiment of the invention, a plurality of electrically conductive contact pads are attached to the exposed exterior surface of the exterior layer with a contact pad placement pattern corresponding to the placement pattern for the apertures. Each of the contact pads is spaced apart out of electrical contact with the other contact pads. The contact pads are attached to the exterior layer at a substantially identical location and orientation on the exterior layer as the planes are attached to the inner layers to position one of the contact pads in general alignment with the correspondingly positioned ones of the apertures. Each of the conductors extends through and is in electrical contact with one of the contact pads.

The board also includes an electrically conductive common pad attached to the exposed exterior surface of the exterior layer. The common pad is spaced out of electrical contact with the contact pads and is attached to the exterior layer at a location on the exterior layer to position the common pad in alignment with the common contact portions of the planes. The common conductor extends between the common pad and the common contact portions of the planes.

In a alternative embodiment of the invention, a plurality of common conductors are utilized, each making electrical contact with a different one of the common contact portions of the planes on the different inner layers. With such an arrangement, the amount of misregistration can be separately determined for each on the inner layers.

The invention may also include a tester having a plurality of electrically conductive probes with a probe placement pattern corresponding to the contact pad placement pattern and the location of the common pad. Each of the probes is movable into electrical contact with a correspondingly positioned one of the contact pads or the common pad. The tester includes means electrically connected to the probes for determining if a conductive path exists between any one of the contact pads and the common pad and for indicating the ones of the contact pads for which a conductive path is determined to exist.

The present invention is also embodied in a printed circuit board of the type described above for use in a system for measuring the amount of misregistration of the printed circuit board layers. The invention also takes the form of a method for measuring the amount of misregistration of printed circuit board layers.

Other features and advantages of the invention will become apparent form the following more detailed description, taken in conjunction with the accompanying drawings.

BRIEF DESCRIPTION OF THE DRAWINGS

FIG. 6 is a reduced-scale, fragmentary view taken substantially along the line 6—6 of FIG. 5.

FIG. 7 is a reduced-scale, fragmentary view taken substantially along the line 7—7 of FIG. 5.

FIG. 9 is a fragmentary sectional view of a board using an alternative embodiment of the invention of FIG. 1.

BEST MODE FOR CARRYING OUT THE INVENTION

Figure 1:
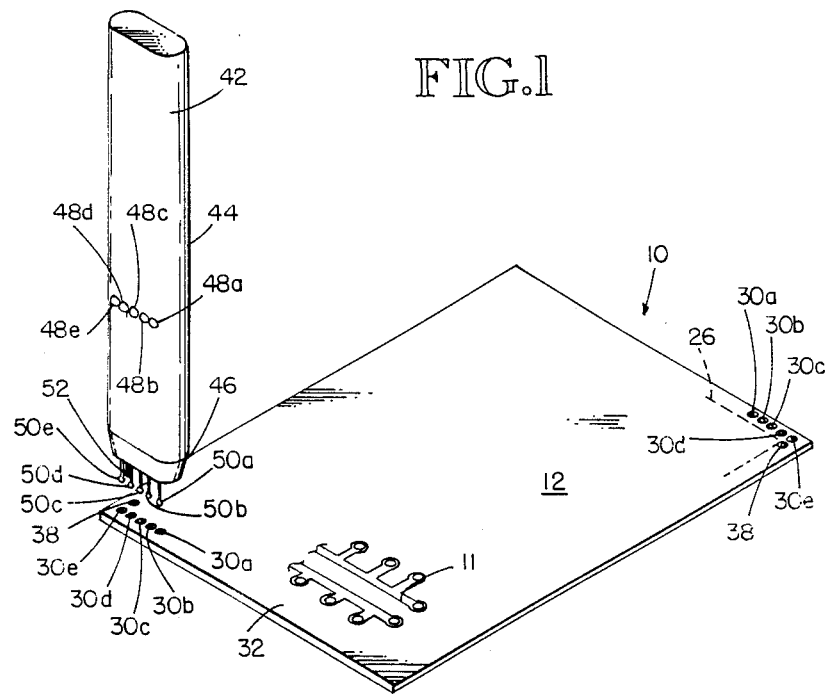
FIG. 1 is a perspective view of a system embodying the present invention, using a modified printed circuit board and a tester.
Figure 3:
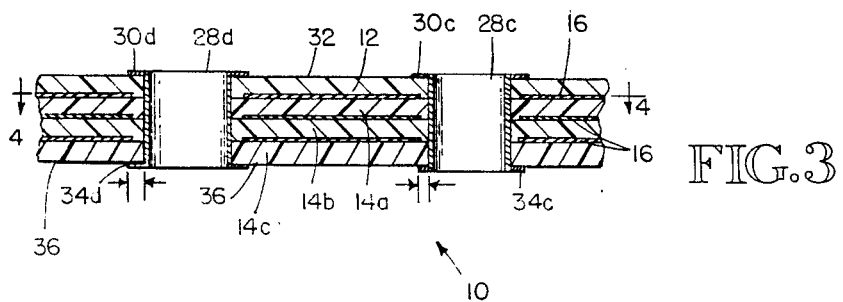
FIG. 3 is an enlarged, fragmentary, sectional view of the board of FIG. 1.

As shown in the drawings for purposes of illustration, the present invention is embodied in a system for measuring the amount of misregistration of printed circuit board layers. The system includes a printed circuit board, indicated generally by reference numeral 10, which includes a plurality of circuit board layers fabricated in face-to-face juxtaposition. As shown in FIG. 1 for the uppermost layer, each of the circuit board layers has electrically conductive traces 11 which require interconnection between the layers. As shown in FIG. 3, the layers include an uppermost exterior layer 12 and a plurality of inner layers, indicated by the reference numerals 14a, 14b and 14c. While the inner layer 14c is referred to as an "inner layer" relative to the exterior layer 12, it is actually at the lowermost position of the circuit board. While the printed circuit board 10 is shown in the drawings as being a four-layer board, the present invention can be practiced with printed circuit boards of any number of multiple layers.

The layers 12 and 14a-c are positioned in registration with each other within a predetermined maximum tolerance range. In other words, if the layers are grossly out of registration, the present invention will not function, but misregistration or misalignment by such a large amount would be evident from visual inspection. The more difficult problem, and the one solved by the present invention, involves the situation in which the hidden inner layers are out of registration with the exterior layer, and hence each other, by a few thousandths of an inch, which is not enough to be visually detectable, but yet is beyond an acceptable tolerance limit. With the present invention, it is possible to determine not only whether or not the inner layers are in registration within a desired tolerance limit, but also the quantitative amount of layer misregistration that exists. It is possible to determine the accuracy of the misregistration within one-thousands of an inch, or less if desired.

The present invention uses an electrically conductive, thin metallic sheet or film, commonly referred to as a registration check plane 16, attached to each of the inner layers 14a–c. The plane 16 may be deposited and shaped on the layers using conventional printed circuit board fabrication techniques as part of the process used to form the traces 11. As such, the planes can be added during the design phase to insure proper placement on the inner layers relative to the traces, and formed using a conventional film and etching process. The traces are formed with almost no extra cost or effort involved.

Figure 2:
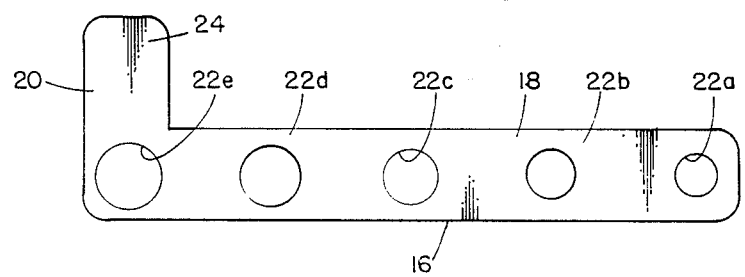
FIG. 2 is an enlarged top plan view of a plane which is attached to each of the inner layers of the board of FIG. 1 prior to assembly of the layers.

The plane 16 is shown in FIG. 2 removed from the inner layers to which it is attached to practice the invention. In the preferred embodiment of the invention, the plane 16 has a generally "L" shape, with a long leg 18 and a short leg 20 extending at a right angle from the long leg 18. The long leg 18 has a linearly aligned series of five circular apertures 22a, 22b, 22c, 22d and 22e therethrough, each of a progressively increasing diameter. In the illustrated embodiment, the diameter for the smallest aperture 22a is 0.034 inch, while the aperture 22b has a diameter of 0.036 inch, the aperture 22c has a diameter of 0.038 inch, the aperture 22d has a diameter of 0.040 inch, and the aperture 22e has a diameter of 0.042 inch. In other words, the apertures 22a–e have predetermined and sequentially increasing diameters with an increment size of 0.002 inch. Because the aperture diameters vary incrementally by 0.002 inch, their radiuses increase by 0.001 inch so that the system is able to sense and quantify misregistration in increments of 0.001 with the embodiment illustrated. By changing the diameter size of the increments of the apertures, a corresponding change in the systems' measuring increment occurs. It is noted that while in this preferred embodiment of the invention, the apertures 22a–e are linearly aligned right to left, as viewed in FIG. 2, from the smallest to the largest diameter aperture. The invention may be successfully practiced with almost any alignment and sequence being used for the apertures. However, the planes 16 attached to the inner layers 14a–c must each have a substantially identical placement pattern of the apertures on the plane.

The short leg 20 of the plane 16 has a common contact portion 24, which will be described in more detail below. As with the apertures 22a–e, the common contact portions 24 for the planes must each have a substantially identical placement on the planes.

In addition to the requirement for a uniform placement pattern of the apertures 22a–e and common contact portion 24 for each plane 16, each plane must be attached at a substantially identical location with a substantially identical orientation on the inner layer to which attached as the other planes are attached to the other inner layers. The attachment of the planes 16 is made prior to the assembly or lamination together of the layers 12 and 14a–e. When the board 10 is fully fabricated, the planes are each sandwiched between the layer to which attached and the immediately adjacent layer, as shown in FIG. 3.

It is desirable to locate the planes 16 on the inner layers 14a–c in the plane setback area of the board, at the board's edge. The plane setback area is indicated by the the broken perimeter line labeled with the reference numeral 26 in FIG. 1 for one corner portion of the board 10. While not visible in FIG. 1, the long leg 18 of the plane 16 can extend along one edge of the board, with the short leg 20 extending along the adjacent edge. In such manner, the planes 16 can be positioned on the board in the plane setback area with little or no impact on the usable area of the board. It is desirable to position planes at opposite corners of the board to achieve a measure of misregistration for the board representative of all places on the board.

With the exterior layer 12 and the inner layers 14a–c laminated together, the apertures 22a–e of each of the planes 16 are in generally coaxial alignment with the correspondingly sized and positioned apertures of the others of the plane. For example, as viewed in FIG. 3, the aperture 22a for every plane is coaxially aligned. The other apertures 22b-e are similarly each aligned with the corresponding apertures. While in general alignment within the maximum tolerance range noted above, the apertures 22a-e of a particular plane may be out of perfect alignment as a result of the inner layer to which the plane is attached being positioned out of registration with the exterior layer. As will be described below, the present invention not only determines that such misregistration exists, but also indicates the amount of the misregistration.

To indicate the amount of the misregistration, the invention uses five electrically conductive through-hole conductors 28a, 28b, 28c, 28d and 28e having a circular cross-section. The conductors are located relative to the exterior layer 12 to position each conductor to extend within the correspondingly positioned ones of the apertures 22a-e of all planes 16 attached to the inner layers 14a-c. In other words, the conductor 28a extends through the aperture 22a of each of the planes 16 attached to the inner layers 14a-c. The conductors are formed by drilling five holes of known and equal diameter in the layers 12 and 14a-c after laminated together. The holes are drilled on the five centers that would exist for the apertures 22a-e if each of the inner layers 14a-c were in perfect alignment with the exterior layer. Each of the holes is then plated to form the five conductors 28a-e.

Figure 4:
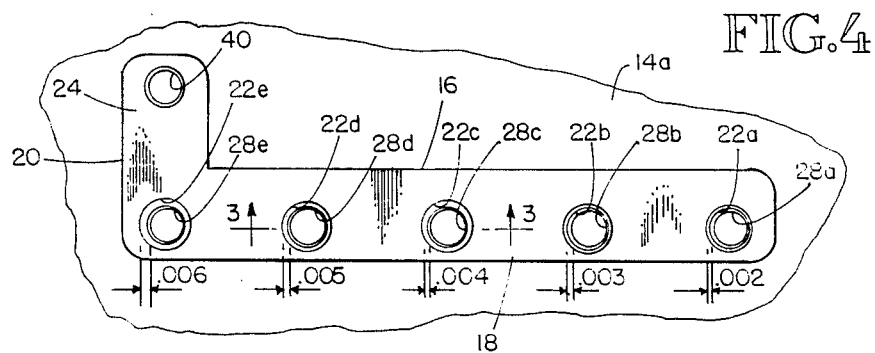
FIG. 4 is an enlarged fragmentary view, taken substantially along the line 4—4 of FIG. 3, showing a board inner layer in perfect registration.

The five conductors 28a-e are best shown in FIG. 4, with a cross-sectional view of conductors 28c and 28d being shown in FIG. 3. With this arrangement, the five conductors 28a-e are positioned out of electrical contact with all of the conductive planes 16 if each of the inner layers 14a-c is in perfect registration with the exterior layer 12, as shown in FIGS. 3 and 4. However, one or more of the conductors 28a-e will be in electrical contact with at least one of the planes 16 if the inner layer to which the plane is attached is out of registration with the exterior layer by a sufficiently large amount.

Since the conductors 28a-e each have a fixed and equal outer diameter and the conductors are formed on center with the apertures 22a-e, as shown in FIG. 4, each conductor will be uniformly spaced apart along its perimeter from the circular edge of the aperture through which it extends by an amount equal to one-half the difference between the diameter of the aperture and the outer diameter of the conductor. In the embodiment of the invention shown in FIG. 4, the outer diameter of the conductor is 0.030 inch. Since the diameter of the aperture 22a is 0.034 inch, the clearance between the conductor 28a and the edge of aperture 22a is 0.002 inch when the inner layers 14a-c, and hence the planes 16 attached thereto, are in perfect registration with the exterior layer 12. The diameter of the aperture 22b is incrementally larger in size, i.e., 0.036 inch in diameter, and the clearance between the conductor 28b and the aperture 22b is 0.003 inch. The clearances are labeled in FIG. 4.

In the presently preferred embodiment, the selected sizes for the apertures 22a-e and the conductors 28a-e are such that the apertures will progressively increase in clearance over the adjacent, smaller diameter aperture a one-thousandths of an inch increment. The varying clearances for the conductors are preselected to indicate with the desired finiteness the amount of misregistration of the inner layers with the exterior layer.

If one of the inner layers 14a-e is out of registration with the exterior layer 12 by an amount at least as great as the clearance between one or more of the conductors 28a-e and the corresponding apertures 22a-e, particular ones of the conductors with clearances less in size than the amount of misregistration will be in electrical contact with the plane. By sensing which of the conductors are in electrical contact with the plane, the amount of misregistration of the inner layers can be determined. The greater any one of the inner layers is out of registration with the exterior layer, the more of the conductors with the corresponding progressively increasing clearances will be in electrical contact with the plane of the inner layer which is out of registration. The amount of misregistration of the inner layer will be known to be at least as great as the clearance for the conductor in electrical contact with the largest clearance, but less than the conductor clearance for the conductor with the next largest clearance which is not in electrical contact with the plane.

The invention is illustrated in FIGS. 3 and 4, with the inner layers 14a-c in perfect registration with the exterior layer 12, and hence the conductors 28a-e extend through the apertures 22a-e without making electrical contact with any of the planes 16 of the inner layers. In comparison, the invention is illustrated in a second printed circuit board 10' in FIGS. 5, 6, and 7, with inner layers 14b and 14c of perfect registration with the exterior layer 12. The plane 16 for inner layer 14c is shown in FIG. 7 with the conductor 28d in electrical contact with the plane. The conductor 28e is, however, not in electrical contact with the plane for the inner layer 14c, thus indicating that the inner layer 14c is out of registration with the exterior layer by more than 0.005 inch, but less than 0.006 inch, the clearances which correspond to the conductors 28d and 28e, respectively. The plane 16 for the inner layer 14b, shown in FIG. 6, is not out of registration by as much as the plane for inner layer 14c, and it has the conductor 28d out of electrical contact with the plane. This, however, cannot be sensed with this embodiment of the invention since at least one other plane (i.e., the plane of layer 14c), is in electrical contact with the conductor 28d.

In the embodiment of the invention presently being described, it is not possible to determine which of the inner layers 14a-c is out of registration, but only that at least one of the inner layers is out of registration and the amount if that misregistration. In other words, while one of the inner layers may be out of registration by a small amount, if there is another inner layer which is out of registration by a greater amount, that misregistration will be used to determine which of the conductors are detected as being in electrical contact with the plane 16 since all the planes are connected together in common, a will be described below.

The printed circuit board 10 further includes five electrically conductive contact pads 30a, 30b, 30c, 30d and 30e attached to an exposed exterior surface 32 of the exterior layer 12. The contact pads are circular and are arranged in a contact pad placement pattern corresponding to the placement pattern for the apertures 22a-e used for the plates 16. Each of the contact pads 30a-e is spaced apart out of electrical contact with the others of the contact pads. The contact pads 30a-e are attached to the exterior layer 12 at a substantially identical location and with a substantially identical orientation on the exterior layer as the planes 16 are attached to the inner layers 14a-c to position one of the contact pads in generally coaxial alignment with the correspondingly positioned ones of the apertures 22a–e. In other words, contact pad 30a is aligned with the aperture 28a of each of the planes 16 for the inner layers 14a–c. An identical set of contact pads 34a–e (not all being shown) are attached to an exposed exterior surface 36 of the inner layer 14c, which is farthest from the exterior layer 12 and is the lowermost exterior layer for the printed circuit board 10.

As noted above, the conductors 28a–e are formed by drilling a hole through the layers 12 and 14a–e and then plating the hole to form a conductor with the shape of a barrel. The holes are drilled through both the contact pads 30a–e and the contact pads 34a–e, and when the drilled hole is plated to form the conductors 28a–e, the plating adheres to the corresponding pair of contact pads. The contact pads serve to prevent the conductors 28a–e from falling out of the drilled holes, and also as electrical contact points on the exterior surfaces of the board.

The printed circuit board 10 also includes an electrically conductive common pad 38 attached to the exposed exterior surface 32 of the exterior layer 12. The common pad 38 is spaced apart out of electrical contact with the contact pads 30a–e. The common pad 38 is attached to the exterior layer at a location on the exterior layer to position the common pad in coaxial alignment with the common contact portions 24 of the planes 16 of the inner layers 14a–c. An identical common pad (not shown) is attached to the exposed exterior surface 36 of the inner layer 14c at a corresponding location. In the same manner as described above for the conductors 28a–e, a through-hole is drilled through both of the common pads, and through the common contact portions 24 of the planes, and is plated to form an electrically conductive, common through-hole conductor 40. The common conductor 40 provides an electrical path between the common pads and the common contact portions 24 of all the planes 16.

With the arrangement described above, when any one of the inner layers 14a–e is out of registration with the exterior layer 12 by a sufficiently large amount, one or more electrically conductive paths are established between the corresponding contact pads 30a–e and the common pad 38. Electrical continuity may be determined by use of a continuity tester 42, such as will be described below. Each of the electrically conductive paths established is through one of the conductors 28a–e, the plane 16 of the inner layer which is out of registration with the exterior layer 12, and the common conductor 40. As described above, this embodiment of the invention indicates the misregistration based upon the inner layer which is out of registration with the exterior layer by the greatest amount, rather than indicating the amount of misregistration of each of the inner layers, as is accomplished with a second embodiment of the invention, shown in FIGS. 9–11. With both embodiments, progressively increasing clearances between the apertures 22a–e and the conductors 28a–e which extend therethrough are used to provide a means by which the amount of misregistration of a hidden inner layer can be quantitatively measured. The larger the conductor clearance of the conductor in electrical contact with a plane, the more misregistration is required to make electrical contact between the conductor and the plane.

While in the embodiments of the invention shown and described herein the apertures have varying diameters and the conductors have a uniform diameter, the invention may be practiced with the apertures' having a uniform diameter and the conductors' having progressively increasing outer diameters. The latter approach is functionally equivalent since in both situations a series of known and progressively increasing clearances exist between the corresponding pairs of conductors and apertures. However, it is easier to drill uniform diameter holes through the printed circuit board 10 and then plate the holes than it is to drill holes of progressively increasing diameter. Furthermore, it is easier to form progressively increasing diameter apertures in the plane by an etching process than it is to drill progressively increasing diameter holes.

Figure 5:
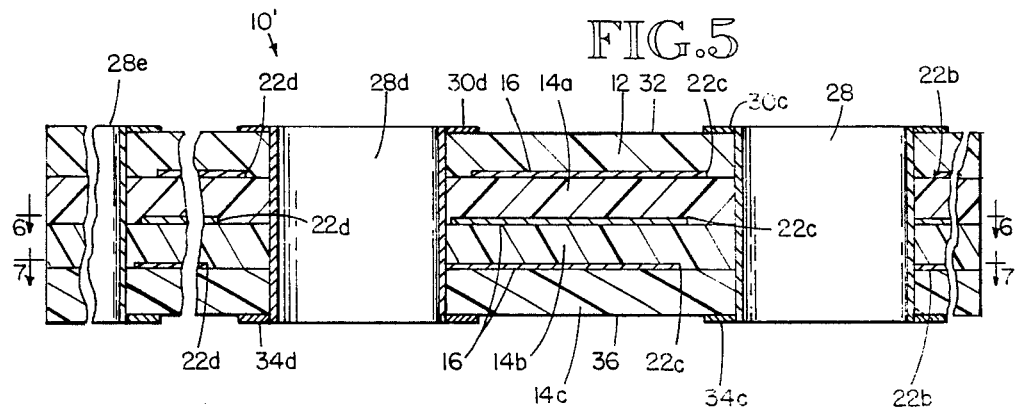
FIG. 5 is a fragmentary sectional view of another board of the type shown in FIG. 1 but having two board inner layers out of perfect registration by differing amounts.

The operation of the invention is further illustrated by reference again to the printed circuit board 10' shown in FIGS. 5, 6 and 7, fabricated according to the first embodiment of the invention. In this printed circuit board 10', the inner layer 14a is shown as being in perfect registration with the exterior layer 12, but the inner layers 14b and 14c are shown as being out of registration, with the inner layer 14c being out of registration by the greatest amount. As can be seen in FIG. 6, the plate 16 for the inner layer 14b is out of registration by a sufficient amount that the edge of the aperture 22c is in electrical contact with the conductor 28c, but not so much out of registration that the edge of the aperture 22d is in electrical contact with the conductor 28d. As such, it is known that the inner layer 14b is out of registration with the exterior layer by at least 0.004 inch but not any greater than 0.005 inch. These amounts are the respective clearances between the conductor 28c and the aperture 22c, and between the conductor 28d and the aperture 22d.

The situation with inner layer 14c was previously described and is similar in that inner layer 14c is out of registration with the exterior layer 12 by a sufficiently large amount that the edge of the aperture 22c is in electrical contact with the connector 28c, but it is also out of registration by a sufficiently large amount that the edge of the aperture 22d is in electrical contact with the conductor 28d. However, the edge of the aperture 22e for the plate 16 of the inner layer 14c is not in electrical contact with the conductor 28e. Thus, it is known that the inner layer 14c is out of registration with the exterior layer 12 by at least 0.005 inch but not any more than 0.006 inch. The planes 16 for each of the inner layers 14b and 14c are shown in FIGS. 6 and 7, respectively.

It can be seen that since in both situations the inner layers 14b and 14c are out of registration by a sufficiently large amount, the conductor 28c engages the edge of the aperture 22c for each plate 16 and the conductors 28a and 28b will also be in electrical contact with the edge of the apertures 22a and 22b. This is because electrical contact is established with these two apertures when the amount of misregistration is only 0.002 inch and 0.003 inch, respectively. Since the amount of misregistration for inner layer 14b exceeds 0.004 inch and for inner layer 14c exceeds 0.005 inch, the amount of misregistration is large enough that when the holes were drilled to form the conductors 28a and 28b, the holes actually cut away a portion of the plate in the vicinity of the apertures 22a and 22b, and effectively changed the contour of their originally circular shape. When the through-holes are plated to form the conductors 28a and 28b, electrical contact is established with the plane 16.

The tester 42, shown in FIG. 1, is a hand-held device with a case 44 and a head 46. Mounted within the case is a battery 48, shown schematically in FIG. 8. The case 44 also supports five light-emitting diodes 48a, 48b, 48c, 48d and 48e which produce visible light when activated.

The head 46 of the tester 42 has mounted thereon five axially spring-loaded probes 50a, 50b, 50c, 50d and 50e and an axially spring-loaded common probe 52. The probes 50a–e and the common probe 52 having a placement pattern corresponding to the placement pattern for the contact pads 30a–e and the common pad 38. With such a placement pattern for the probes on the head 46, the tester may be conveniently grasped by the user and held with the probes in electrical contact with the contact pads and common pad to accomplish the continuity check referred to above.

Figure 8:
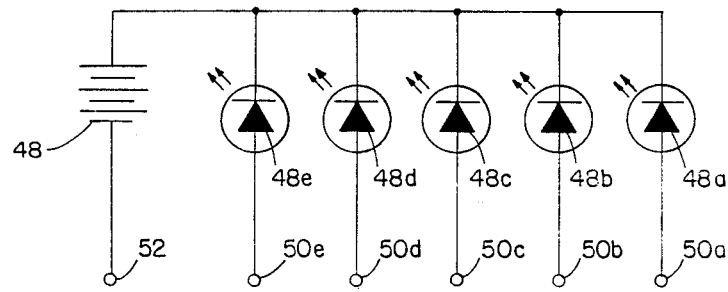
FIG. 8 is a schematic diagram of the circuitry for the tester shown in FIG. 1.

As shown in FIG. 8, the anode of each of the light-emitting diodes 48a–e is connected to a corresponding one of the probes 50a–e, and the cathodes of the light-emitting diodes are connected together and to the positive terminal of the battery 48. The negative terminal of the battery is connected to the common probe 52. As such, if one or more of the conductors 28a–e are in electrical contact with the plate 16 of one of the inner layers 14a–c as a result of misregistration of the inner layer, a complete circuit is accomplished and current flows through the corresponding light-emitting diodes. For example, with the printed circuit board 10' shown in FIG. 5, since the misregistration of inner layers 14b and 14c is sufficient that the planes 16 for these layers are each in electrical contact with the conductors 28a, 28b and 28c, an electrical circuit is completed which will cause light-emitting diodes 48a, 48b and 48c to be illuminated. Also, since the plane 16 for the inner layer 14c is also in electrical contact with the conductor 28d, an electrical circuit is completed which will cause the light-emitting diode 48d to be illuminated. The fact that the plane 16 for the inner layer 14b is not in contact with the conductor 28d has no effect since at least one of the other inner layers has its plane in contact with the conductor 28d. Since none of the planes for the inner layers 14a–c are in contact with the conductor 28e, nonconductive clearance is maintained between the planes and the conductor 28e and no electrical circuit is completed which will cause light-emitting diode 48e to be illuminated. In each instance just discussed, the electrical circuit is completed since the planes 16 have their common contact portions 42 connected together by the common conductor 40 to complete the circuit between one of the probes 50a–e and the common probe 52.

The illumination of light-emitting diodes 48a–d indicates that the printed circuit board 10' one of the inner layers 14a–c out of registration with the exterior layer 12 by at least 0.005 inch but less than 0.005 inch. Of course, if the misregistration were of sufficient enough size that one of the planes was in electrical contact with the conductor 28e, the light-emitting diode 48e would also be illuminated and the user would know that at least one of the inner layers was out of registration by more than 0.006 inch. It would not, however, be possible to determine by how much more the inner layer was out of registration. By selecting a sufficiently large number of conductors and corresponding apertures so that incrementally increasing clearances can be achieved with a sufficiently small incremental size and a sufficient large number of such clearances will produce an adequate range of tolerances which can be measured, any printed circuit board having a misregistration of at least one of its inner layers sufficient to cause all of the light-emitting diodes to illuminate will be known to be so far out of tolerance that it must be rejected even though the precise amount of misregistration cannot determined.

With the present invention, the quantitative amount of misregistration can be measured very precisely, easily, and economically. Furthermore, not only can one determine if the printed circuit board is within a desired tolerance limit, it can be determined how close the inner layers of the board are to the tolerance limit. In such fashion, if a board indicates that at least one of the inner layers is out of registration by more than 0.004 inch but not by 0.005 inch, the board can be rejected if the tolerance limit is set as 0.005 inch since it may fail during use. However, if the board indicates that the inner layers are out of registration by more than 0.003 inch but less than 0.004 inch, it is known that an adequate margin of safety exists since the misregistration is at least 0.001 inch or possibly up to 0.002 inch less than the maximum tolerance limit. In such manner, printed circuit boards that might test as satisfactory using a conventional pass/no-pass continuity test, but yet be out of registration by a sufficient amount that the board might fail during use, can be identified with the present invention. Further, since the present invention provides a means of very precisely determining the amount of misregistration, the designers not need build extremely large safety margins into their designs, as was the case when the precise amount of misregistration could not be measured.

Figure 10:
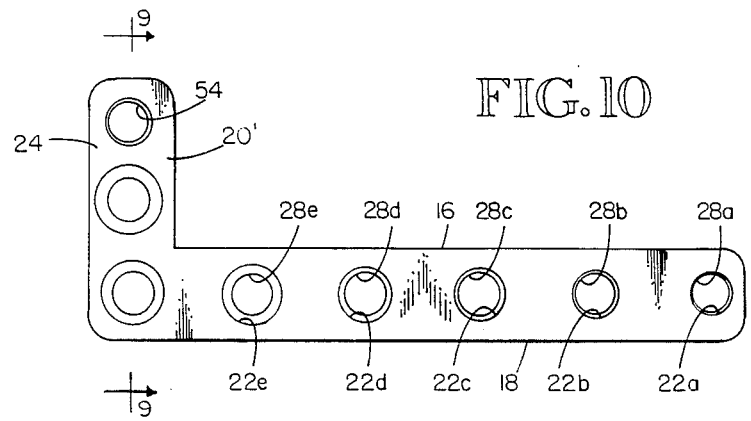
FIG. 10 is a reduced-scale, fragmentary view taken substantially along the line 10—10 of FIG. 9.
Figure 11:
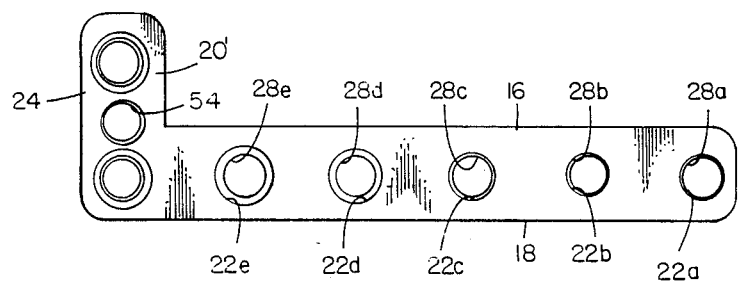
FIG. 11 is a reduced-scale, fragmentary view taken substantially along the line 11—11 of FIG. 9.

In certain situations, it may be desirable to separately measure the misregistration of each of the inner layers 14a–c relative to the exterior layer, rather than simply the maximum amount of misregistration for the board. This may be accomplished using planes very similar in design to the plane 16 described above, however, without connecting the common contact portions 24 of the planes together. Further, each of the planes is provided with its own common conductor. A cross section of a printed circuit board 100 is shown in FIG. 9 utilizing a separate common conductor 54 for each of the planes 16a, 16b and 16c, which are attached to the inner layers 14a, 14b and 14c, respectively. The planes used in this alternative embodiment are of similar construction to those of the first embodiment; however, a slightly different design of plane must be used for each inner layer, as best shown in FIGS. 10 and 11. The short leg 20' of the planes 16a–c has a length sufficient to provide a uniquely positioned, common contact portion 24 for each plane, with the position depending upon the inner layer with which the plane is to be used. Further, enlarged apertures are provided at locations aligned with the common conductors to be connected to the other planes so that those common conductors pass through the enlarged apertures without making electrical contact with the plane. Thus, the plane used for each of the inner layers is in electrical contact with only its own common conductor and the amount of misregistration of each of the inner layers can be separately measured. The common conductors 54 each utilize a conductive pad 56 attached to the exposed exterior surface 32 of the exterior layer 12 and an identical common pad 58 attached to the exposed exterior surface of the inner layer 14c at a corresponding location.

The tester to be used with this alternative embodiment of FIGS. 9–11 requires a common probe to be positioned to be selectively movable between these several common conductors so that the light-emitting diodes 48a–e, when illuminated, will indicate the amount of misregistration for the particular inner layer having the plane corresponding to the common contact then engaged by the common probe. Alternatively, a separate set of light-emitting diodes and a common probe for each common contact can be used for each of the inner layers to separately accomplish the continuity check required with the present invention and visually indicate the results.

It is to be understood that while a hand-held tester using light-emitting diodes to provide a visual indication of the amount of misregistration has been described, the tester need not be hand-held and may be incorporated into a computer-based, automatic test system in which the continuity check is accomplished automatically and the results displayed or recorded in other manners or used in the process of automatically determining whether a printed circuit board is sufficiently in registration to be used. Whether or not in a hand-held tester configuration, the light-emitting diodes can be replaced with a digital numerical display and associated circuitry.

It will be appreciated that, although specific embodiments of the invention have been described herein for purposes of illustration, various modifications may be made without departing from the spirit and scope of the invention. Accordingly, the invention is not be limited except as by the appended claims.

I claim:

1. A system for measuring the amount of misregistration of printed circuit board layers, comprising:

a printed circuit board with a plurality of layers fabricated in face-to-face juxtaposition, each having electrically conductive traces which require interconnection between said layers, said layers including an exterior layer and a plurality of inner layers inwardly located relative to said exterior layer, said layers being positioned in registration with each other within a predetermined maximum tolerance range;

a plurality of electrically conductive planes, each having a plurality of apertures therethrough and a common contact portion, said apertures and common contact portion for each said plane having a substantially identical placement pattern on said plane, each said plane being attached to one of said inner layers at a substantially identical location and orientation on said inner layer as the others of said planes are attached to the others of said inner layers, attachment being made prior to the assembly of said inner layers together to fabricate the circuit board, whereby said apertures of each one of said planes are in general alignment within said maximum tolerance range with correspondingly positioned ones of said apertures of the others of said planes, subject to deviation from perfect alignment as a result of said inner layers being positioned out of registration with said exterior layer during fabrication of the circuit board;

a plurality of electrically conductive through-hole conductors formed in said layers after fabricated in face-to-face juxtaposition, said conductors being located relative to said exterior layer to position each said conductor to extend through to extend through said layers and within correspondingly positioned ones of said apertures of each said plane attached to said inner layers, said conductors each having a conductor contact portion at said exposed exterior surface of said exterior layer, each of said conductors and the correspondingly positioned ones of said apertures through which extending having relative sizes to produce a clearance therebetween if said inner layer is in perfect registration with said exterior layer, with said clearance for each of said conductors being of a predetermined and incrementally increasing size, said conductors being out of electrical contact with any of said planes if each said inner layer is in perfect registration with said exterior layer, and one or more of said conductors being in electrical contact with at least one of said planes if said inner layer to which attached is out of registration with said exterior layer by an amount at least as great as the smallest of said clearances, the incrementally increasing clearances for any of said conductors in electrical contact with one of said planes indicating the amount of misregistration of at least one of said inner layers with said exterior layer;

an electrically conductive, common through-hole conductor formed in said layers and being located relative to said exterior layer to position said common conductor to extend through each of said common contact portions of said planes in electrical contact therewith, said common conductor having a monnon conductor contact portion at said exposed exterior surface of said exterior layer, when any one of said inner layers is out of registration with said exterior layer by a sufficiently large amount within said maximum tolerance range, one or more electrically conductive paths are established between the corresponding ones of said conductors, said plane of said inner layer out of registration and said common conductor, and the greater any one of said inner layers is out of registration with said exterior layer, the more of said conductors with the greater of said clearances with respect to the correspondingly positioned ones of said apertures are in electrical contact with said plane of said inner layer which is out of registration, with the particular ones of said conductors in electrical contact with said plane indicating the amount of misregistration of said inner layer within said maximum tolerance range; and a tester having a plurality of electrically conductive probes with a probe placement pattern corresponding to the placement pattern on said exterior surface of said exterior layer of said conductor contact portion of said conductors and said common conductor contact portion of said common conductor, each of said probes being movable into electrical contact with a correspondingly positioned one of said conductor contact portions of said common conductor contact portion, said tester including means electrically connected to said probes for determining if a conductive path exists between any one of said conductor contact portions and said common conductor contact portion and for indicating the ones of said conductor contact portions for which a conductive path is determined to exist, whereby the amount of layer misregistration is quantitatively indicated.

2. A system for measuring the amount of misregistration of printed circuit board layers, comprising:

a printed circuit board with a plurality of layers fabricated in face-to-face juxtaposition, each having electrically conductive traces which require interconnection between said layers, said layers including an exterior layer and a plurality of inner layers inwardly located relative to said exterior layer, said layers being positioned in registration with each other within a predetermined maximum tolerance range;

a plurality of electrically conductive planes, each having a plurality of apertures therethrough and a common contact portion, said apertures and common contact portion for each said plane having a substantially identical placement pattern on said plane, each said plane being attached to one of said inner layers at a substantially identical location and orientation on said inner layer as the others of said planes are attached to the others of said inner layers, attachment being made prior to the assembly of said inner layers together to fabricate the circuit board, whereby said apertures of each one of said planes are in general alignment within said maximum tolerance range with correspondingly positioned ones of said apertures of the others of said planes, subject to deviation from perfect alignment as a result of said inner layers being positioned out of registration with said exterior layer during fabrication of the circuit board;

a plurality of electrically conductive contact pads attached to an exposed exterior surface of said exterior layer with a contact pad placement pattern corresponding to said placement pattern for said apertures, each said contact pad being spaced apart out of electrical contact with the others of said contact pads, said contact pads being attached to said exterior layer at a substantially identical location and orientation on said exterior layer as said planes are attached to said inner layers to position one of said contact pads in general alignment within said maximum tolerance range with the correspondingly positioned ones of said apertures;

a plurality of electrically conductive through-hole conductors formed in said layers after fabricated in face-to-face juxtaposition, said conductors being located relative to said exterior layer to position each said conductor to extend through one of said contact pads in electrical contact therewith and to extend within corrrespondingly positioned ones of said apertures of each said plane attached to said inner layers, each of said conductors and the correspondingly positioned ones of said apertures through which extending having relative sizes to produce a clearance therebetween if said inner layer is in perfect registration with exterior layer, with said clearance for each of said conductors being of a predetermined and incrementally increasing size, said conductors being out of electrical contact with any of said planes if each said inner layer is in perfect registration with said exterior layer, and one or more of said conductors being in electrical contact with at least one of said planes if said inner layer to which attached is out of registration with said exterior layer by an amount at least as great as the smallest of said clearances, the incrementally increasing clearances for any of said conductors in electrical contact with one of said planes indicating the amount of misregistration of at least one of said inner layers with said exterior layer;

an electrically conductive common pad attached to said exposed exterior surface of said exterior layer and spaced apart out of electrical contact with said contact pads, said common pad being attached to said exterior layer at a location on said exterior layer to position said common pad in alignment with said common contact portions of said planes;

an electrically conductive, common through-hole conductor formed in said layers and being located relative to said exterior layer to position said common conductor to extend through said common pad in electrical contact therewith and to extend through each of said common contact portions of said planes in electrical contact therewith, when any one of said inner layers is out of registration with said exterior layer by range, one or more electrically conductive paths are established between said contact pads and said common pad through the corresponding ones of said conductors, said plane of said inner layer out of registration and said common conductor, and the greater any one of said inner layers is out of registration with said exterior layer, the more of said conductors with the greater of said clearances with respect to the correspondingly positioned ones of said apertures are in electrical contact with said plane of said inner layer which is out of registration, with the particular ones of said conductors in electrical contact with said plane indicating the amount of misregistration of said inner layer within said maximum tolerance range; and a tester having a plurality of electrically conductive probes with a probe placement pattern corresponding to said contact pad placement pattern and the location of said common pad, each of said probes being movable into electrical contact with a correspondingly positioned one of said contact pads or said common pad, said tester including means electrically connected to said probes for determining if a conductive path exists between any one of said contact pads and said common pad and for indicating the ones of said contact pads for which a conductive path is determined to exist, whereby the amount of layer misregistration is quantitatively indicated.

3. A method of measuring the amount of misregistration of printed circuit board layers, comprising:

providing a printed circuit board with a plurality of layers fabricated in face-to-face juxtaposition, each having electrically conductive traces which require interconnection between said layers, said layers including an exterior layer and at least one inner layer, said layers being positioned in registration with each other within a predetermined maximum tolerance range;

providing an electrically conductive plane having a plurality of apertures therethrough and a common contact portion, said apertures and common contact portion for said plane having a predetermined pattern on said plane;

attaching said plane to said inner layer prior to the assembly of said inner layers together to fabricate the circuit board;

providing a plurality of electrically conductive conductors formed in said layers after fabricated in face-to-face juxtaposition;

locating said conductors relative to said exterior layer to position each said conductor to extend through said layers within correspondingly positioned ones of said apertures of said plane attached to said inner layer, each of said conductors and the correspondingly positioned ones of said apertures through which extending having relative sizes to produce a clearance therebetween if each said inner layer is in perfect registration with said exterior layer, with said clearances for said conductors being of predetermined and progressively increasing size, said conductors being out of electrical contact with said planes if said inner layer is in perfect registration with said exterior layer, and one or more of said conductors being in electrical contact with said plane if said inner layer to which attached is out of registration with said exterior layer by an amount at least as great as the corresponding conductor clearance, the progressively increasing clearances for any of said conductors in electrical contact with said plane indicating the amount of misregistration of said inner layer with said exterior layer;

providing an electrically conductive common conductor formed in said layers;

locating said common conductor to extend from said exterior layer to said common contact portion of said plane in electrical contact therewith, when said inner layer is out of registration with said exterior layer by a sufficiently large amount within said maximum tolerance range, one or more electrically conductive paths are established between said conductors, said plane of said inner layer out of registration and said common conductor, and the greater said inner layer is out of registration with said exterior layer, the more of said conductors with the corresponding progressively increasing clearances are in electrical contact with said plane, with the particular ones of said conductors in electrical contact with said plane indicating the amount of misregistration of said inner layer is at least as large as the corresponding conductor clearance, but less than the conductor for the next largest conductor clearance for said conductors not in electrical contact with any of said planes; and providing means for determining if a conductive path exists between any one of said conductors and said common conductor and for indicating the one or more of said conductors for which a conductive path is determined to exist, whereby the method measures and indicates the amount of inner layer misregistration.

4. A method of measuring the amount of misregistration of printed circuit board layers, comprising:

providing a printed circuit board with a plurality of layers fabricated in face-to-face juxtaposition, each having electrically conductive traces which require interconnection between said layers, said layers including an exterior layer and a plurality of inner layers inwardly located relative to said exterior layer, said layers being positioned in registration with each other within a predetermined maximum tolerance range;

providing a plurality of electrically conductive planes, each having a plurality of apertures therethrough and a common contact portion, said apertures and common contact portion for each said plane having a substantially identical placement pattern on said plane;

attaching each said plane to one of said inner layers at a substantially identical location and orientation on said inner layer as the others of said planes are attached to the others of said inner layers, attachment being made prior to the assembly of said inner layers together to fabricate the circuit board, whereby said apertures of each one of said planes are in general alignment within said maximum tolerance range with correspondingly positioned ones of said apertures of the others of said planes, subject to deviation from perfect alignment as a result of said inner layers' being positioned out of registration with said exterior layer during fabrication of the circuit board;

providing a plurality of electrically conductive contact pads;

attaching said contact pads to an exposed exterior surface of said exterior layer with a contact pad placement pattern corresponding to said placement pattern for said apertures, each said contact pad being spaced apart out of electrical contact with the others of said contact pads, said contact pads being attached to said exterior layer at a substantially identical location and orientation on said exterior layer as said planes are attached to said inner layers to position one of said contact pads in general alignment within said maximum tolerance range with the correspondingly positioned ones of said apertures;

providing a plurality of electrically conductive through-hole conductors of substantially equal width formed in said layers after fabricated in face-to-face juxtaposition;

locating said conductors relative to said exterior layer to position each said conductor to extend through one of said contact pads in electrical contact therewith and to extend within correspondingly positioned ones of said apertures of each said plane attached to said inner layers, each of said conductors and the correspondingly positioned ones of said apertures through which extending having relative sized to produce a clearance therebetween if each said inner layer is in perfect registration with said exterior layer, with said clearances for each of said conductors being of a predetermined and incrementally increasing size, said conductors being out of electrical contact with any of said planes if each said inner layer is in perfect registration with said exterior layer, and one or more of said conductors being in electrical contact with at least one of said planes if said inner layer to which attached is out of registration with said exterior layer by a sufficiently large amount, the varying size of said apertures being preselected to indicate varying amounts of misregistration of at least one of said inner layers with said exterior layer;

providing an electrically conductive common pad;

attaching said common pad to said exposed exterior surface of said exterior layer spaced apart out of electrical contact with said contact pads, with said common pad being attached to said exterior layer at a location on said exterior layer to position said common pad in alignment with said common contact portions of said planes;

providing an electrically conductive, common through-hole conductor formed in said layers;

locating said common conductor relative to said exterior layer to position said common conductor to extend through said common pad in electrical contact therewith and to extend through each of said common contact portions of said planes, when any one of said inner layers is out of registration with said exterior layer by a sufficiently large amount within said maximum tolerance range, one or more electrically conductive paths are established between said contact pads and said common pad through the corresponding ones of said conductors, said plane of said inner layer out of registration and said common conductor, and the greater any one of said inner layers is out of registration with said exterior layer, the more of said conductors with the greater of said clearances with respect to the correspondingly positioned ones of said apertures are in electrical contact with said plane of said inner layer which is out of registration, with the particular ones of said conductors in electrical contact with said plane indicating the amount of misregistration of said inner layer which is out of registration thereof within said maximum tolerance range; and providing means for determining if a conductive path exists between any one of said contact pads and said common pad and for indicating the one or more of said contact pads for which a conductive path is determined to exist, whereby the method measures and indicates the amount of layer misregistration.

* * * * *

UNITED STATES PATENT AND TRADEMARK OFFICE
CERTIFICATE OF CORRECTION

PATENT NO. : 4,894,606

DATED : January 16, 1990

INVENTOR(S) : Tom R. Paur

It is certified that error appears in the above-identified patent and that said Letters Patent is hereby corrected as shown below:

In claim 2, column 16, line 12, following "layer by" insert --a sufficiently large amount within said maximum tolerance--.

In claim 3, column 17, line 36, following "the conductor" insert --clearance--.

In claim 4, column 18, line 36, delete "sized" and substitute therefor --sizes--.

Signed and Sealed this

Fifteenth Day of January, 1991

Attest:

HARRY F. MANBECK, JR.

Attesting Officer

Commissioner of Patents and Trademarks